(12) United States Patent
Lin

(10) Patent No.: US 6,465,808 B2
(45) Date of Patent: Oct. 15, 2002

(54) METHOD AND STRUCTURE FOR FORMING AN ELECTRODE ON A LIGHT EMITTING DEVICE

(75) Inventor: Ming-Der Lin, Hsinchu (TW)

(73) Assignee: Highlink Technology Corporation (TW)

( * ) Notice: Subject to any disclaimer, the term of this patent is extended or adjusted under 35 U.S.C. 154(b) by 0 days.

(21) Appl. No.: 09/757,478

(22) Filed: Jan. 11, 2001

(65) Prior Publication Data

US 2002/0063256 A1 May 30, 2002

(30) Foreign Application Priority Data

Nov. 24, 2000 (TW) ........................................ 89125077 A

(51) Int. Cl.7 ............................................... H01L 27/15
(52) U.S. Cl. ............................. 257/81; 257/98; 257/99
(58) Field of Search ................................ 257/79, 81, 99, 257/98; 29/590; 372/50; 313/504, 503; 437/23

(56) References Cited

U.S. PATENT DOCUMENTS

| 4,232,440 | A | * | 11/1980 | Bastek | ........................ 29/590 |
|---|---|---|---|---|---|
| 5,358,880 | A | * | 10/1994 | Lebby et al. | .................. 437/23 |
| 5,608,287 | A | * | 3/1997 | Hung et al. | .................. 313/503 |
| 5,822,351 | A | * | 10/1998 | Kang | ........................... 372/50 |
| 5,917,202 | A | * | 6/1999 | Haitz et al. | .................... 257/98 |
| 6,278,236 | B1 | * | 8/2001 | Madathil et al. | ............ 313/504 |

* cited by examiner

*Primary Examiner*—David Nelms
*Assistant Examiner*—Tu-Tu Ho

(57) ABSTRACT

A method and structure for forming an electrode on a light emitting device. The present invention provides a transparent electrode or a reflective electrode formed on a p-type gallium nitride-based compound semiconductor. The electrode comprises a plurality of opaque ohmic contact dots formed on the p-type gallium nitride-based compound semiconductor and a transparent conductive layer (or a light reflective conductive layer) covering the p-type gallium nitride-based compound semiconductor. Utilizing the present invention, the electrode is suitable for any light emitting device, and the light efficiency of the light emitting device is higher than that of the conventional light emitting device. Furthermore, the process of forming the electrode is easier than that of the conventional process.

41 Claims, 3 Drawing Sheets

METHOD AND STRUCTURE FOR FORMING AN ELECTRODE ON A LIGHT EMITTING DEVICE

FIELD OF THE INVENTION

The present invention relates to a method and structure for forming an electrode on a light emitting device. More particularly, the present invention relates to the method and structure for providing a plurality of ohmic contact dots formed on a light emitting device.

BACKGROUND OF THE INVENTION

In recent years, a great deal of attention has been directed to light-emitting devices utilizing gallium nitride-based III-V group semiconductors such as GaN, AlGaN, InGaN, and AlInGaN. Furthermore, a transparent sapphire substrate is usually used for such devices. Different from a conductive substrate used for the other semiconductor light-emitting device, sapphire is electrically insulated. Thus, it is not possible to mount, directly on the substrate, electrodes for supplying a predetermined current to the compound semiconductor layer causing the device to emit light. Both p-electrode and n-electrode must be formed in direct contact with the p-type compound semiconductor layer and the n-type compound semiconductor layer, respectively.

Referring to FIG. 1, a top view shows the conventional gallium nitride-based III-V group semiconductor light-emitting device. Referring to FIG. 2, a cross-sectional view is taken along the line IV—IV of FIG. 1. The light-emitting device has a structure in which a layer of an n-type GaN 20, a layer of an n-type AlGaN 30, an active layer 40 (which is selected by using InGaN, AlInGaN or GaN to form the double hetero-junction or quantum well structure), a layer of an p-type AlGaN 50, and a layer of an p-type GaN 60 are all stacked on a sapphire substrate 10.

After etching process, a portion of the n-type GaN 20 is exposed. Then, the first electrode 70 and the second electrode 80 are formed respectively on the exposed n-type GaN surface 20 and on the exposed p-type GaN surface 60. The first electrode 70 comprises a metallic material. The metallic material that achieves preferable ohmic characteristics contains two metals of titanium formed in direct contact with the n-type GaN layer 20, and a layer of aluminum formed on the titanium layer. In order to obtain a perfect ohmic contact, annealing the metallic material layer is required. The annealing treatment is preferably conducted at a temperature of 400 degree. C. or more.

Because the carrier concentration of the p-type GaN is only $5\times10^{17}/cm^3$, the second electrode 80, which is not similar to the small area of the first electrode 70, will cover the most part of the p-type GaN 60 exposed surface to spread the current. The second electrode 80 is formed to directly cover an entire exposed surface of the p-type GaN layer 60 for increasing the efficiency of the current spreading. But the second electrode 80 will shade the light emitting from the light emitting device. In this way, a thin second electrode 80 is formed on the p-type GaN 60 to transmit the light emitting from the light emitting device. A light transmitting electrode provided in contact with the p-type semiconductor layer is described in the U.S. Pat. No. 5,563,422. That is a gallium nitride-based III-V compound semiconductor device and method of producing the same. The second electrode 80 may be formed by any suitable metallic material. A particularly preferable metallic material contains gold and nickel. Gold and nickel are preferably formed such that a layer of nickel is formed in direct contact with the p-type GaN layer 60, and a layer of gold is formed upon the nickel layer. The annealing treatment is preferably conducted at a temperature of 400 degree. C. or more. A metallic material used for the second electrode 80 is preferably formed such that the annealed material has a thickness of 10 angstrom to 1000 angstrom. By adjusting the thickness of the second electrode 80 in the range of 10 angstrom to 1000 angstrom, the second electrode 80 can be rendered light-transmission. Due to the thin second electrode 80, a bonding pad 90 is contacted to the p-type GaN layer 60. The process of forming the bonding pad 90 is to firstly form a window 95 upon the second electrode 80 exposing the p-type GaN layer 60 surface. The bonding pad 90 is then formed covering portions of the second electrode 80 and adhering on the p-type GaN layer 60 surface.

Because the second electrode 80 is formed by metallic material, the process of forming the thickness of second electrode 80 should be seriously concerned. If the thickness of the second electrode 80 is thicker than that of expectation, most of the light emitting from the light emitting device will be absorbed by the second electrode 80 causing a poor transparent efficiency. If the thickness is thinner than that of expectation, it is difficult to have a second electrode 80 with good ohmic characteristics. Furthermore, the second electrode 80 of predetermined thickness formed on the p-type GaN layer 60, it is inevitable that a constant portion of the light emitting from the light emitting device will be absorbed by the second electrode 80 causing a low transparent efficiency of about between 60% and 80%.

Referring FIG. 3, a schematic diagram shows the conventional GaAs-based, InP-based, GaP-based, SiC-based or ZnSe-based light emitting device. The light emitting device includes at least an n-type substrate 96, an n-type semiconductor layer 98, an active layer 100, a p-type semiconductor layer 102, an n-electrode 104, and a p-electrode 106. Generally speaking, after the n-electrode 104 and the p-electrode 106 are formed, the annealing treatment is then processed. Consequently, regions of high light absorption are formed on the ohmic contact area, and cause the difficulty of fabricating a device with higher output efficiency.

SUMMARY OF THE INVENTION

It is therefore an object of this invention to provide a method and structure for forming an electrode on a light emitting device. The present invention provides a brand-new method and structure to form the transparent electrode or reflective electrode on a p-type gallium nitride-based compound semiconductor. The electrode comprises a plurality of opaque ohmic contact dots formed on the p-type gallium nitride-based compound semiconductor and a transparent conductive layer (or a light reflective conductive layer) covering the p-type gallium nitride-based compound semiconductor.

It is another object of this invention to provide a method and structure for forming an electrode on a light emitting device. Comparing with the conventional electrode formed on p-type GaN-based III-V compound semiconductor, the present invention has advantages of higher light penetration and easier in process. Moreover, utilizing the present invention, the electrode is suitable for any light emitting devices. The output efficiency of the light emitting device is higher than that of a conventional light emitting device. Furthermore, this process of forming the electrode is easier than that of the conventional process.

In accordance with all aspects of this invention, this invention provides a structure for forming an electrode on a light emitting device, comprising: a semiconductor layer of a light emitting device having a first surface and a second surface, a plurality of ohmic contact dots formed on said first surface, and a conductive layer covering said ohmic contact dots and said first surface.

In accordance with the aforementioned objects of this invention, this invention provides a method for forming an electrode on a light emitting device, comprising: forming a plurality of contact dots on the surface of a semiconductor layer of a light emitting light device, carrying out an annealing treatment, forming a conductive layer covering said contact dots and said surface.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
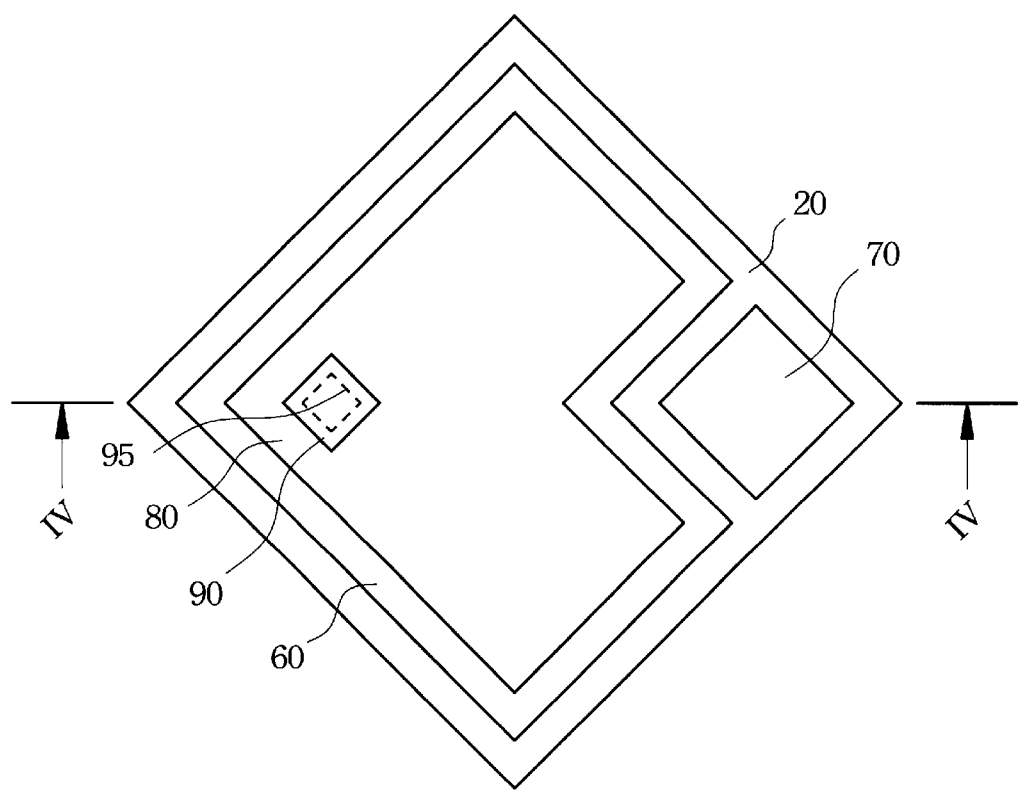
FIG. 1 is a top view showing the conventional gallium nitride-based III-V group semiconductor light emitting device.
Figure 2:
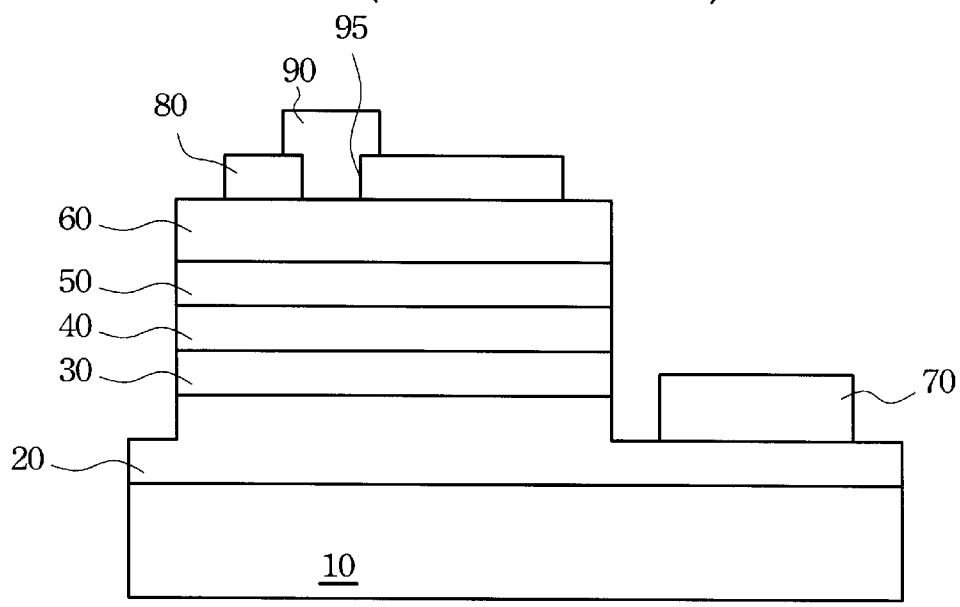
FIG. 2 is a cross-sectional view taking along the line IV—IV of FIG. 1.
Figure 3:
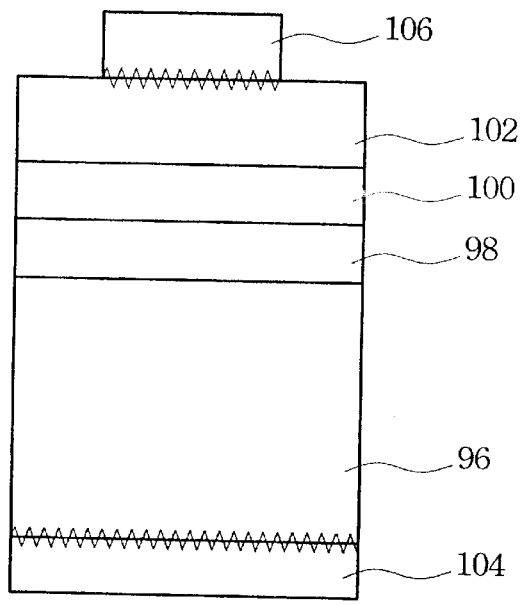
FIG. 3 shows the conventional GaAs-based, InP-based, GaP-based, SiC-based or ZnSe-based light emitting device.
Figure 4:
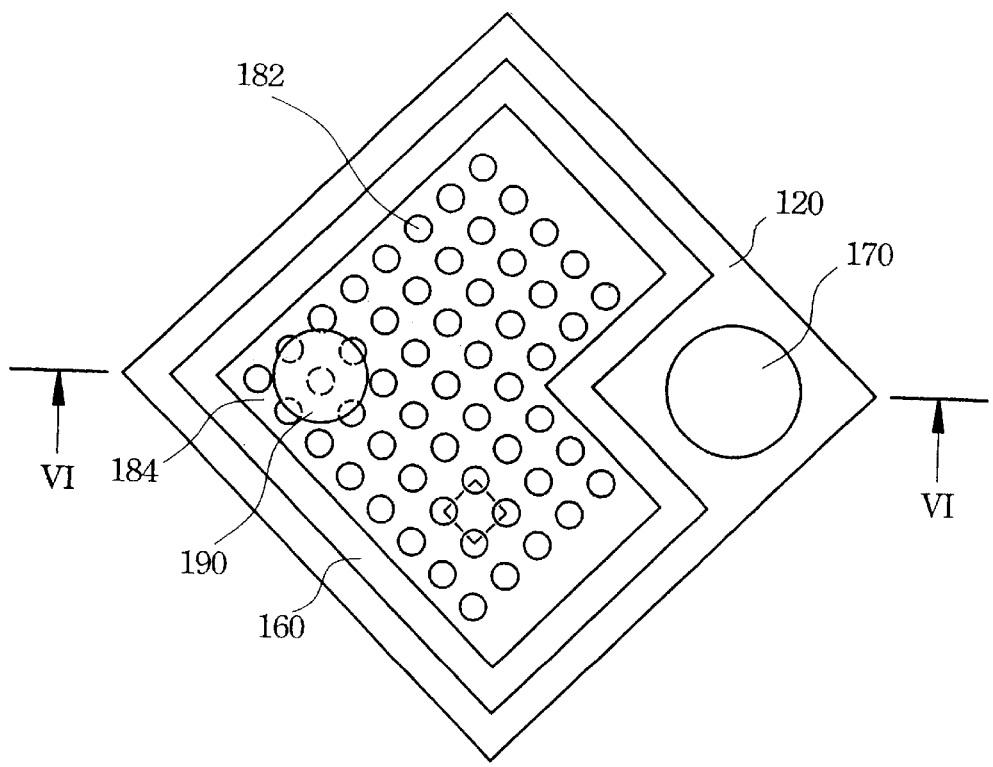
FIG. 4 is a top view showing the gallium nitride-based III-V group semiconductor light emitting device of the present invention.
Figure 5:
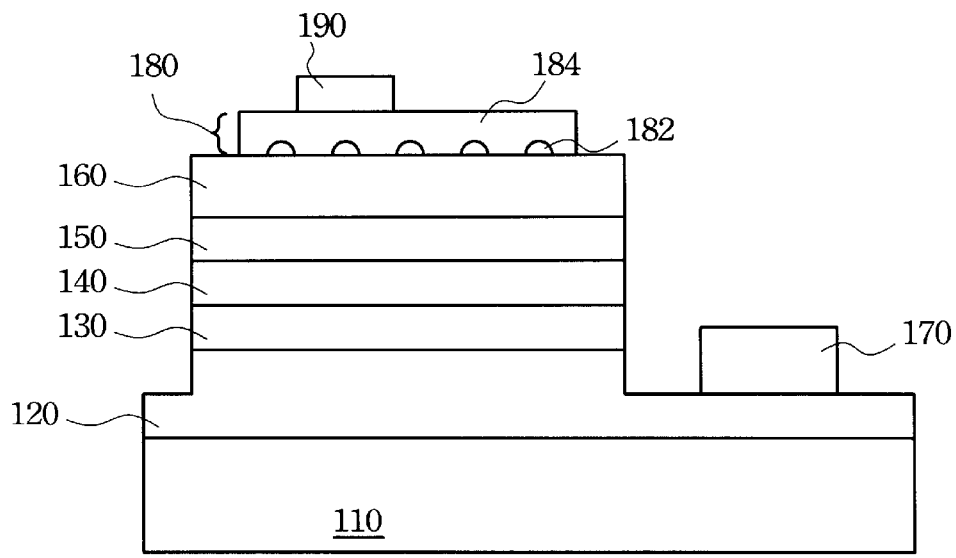
FIG. 5 is a cross-sectional view taking along the line VI—VI of FIG. 4.

Referring to FIG. 4, a top view shows the gallium nitride-based III-V group semiconductor light emitting device of the present invention. Referring to FIG. 5, a cross-sectional view is taken along the line VI—VI of FIG. 4. The light-emitting device has a structure in which a layer of an n-type GaN 120, a layer of an n-type AlGaN 130, an active layer 140 (which is selected by using InGaN, AlInGaN or GaN to form the double heterojunction or quantum well structure), a layer of an p-type AlGaN 150, and a layer of an p-type GaN 160 are stacked upon a sapphire substrate 110.

The semiconductor layers above the n-type GaN layer 130,140,150, and 160 are partially etched away, together with a surface portion of the n-type GaN layer 120, to partially expose the surface of the n-type GaN layer 120. Then, the first electrode 170 and the second electrode 180 are formed respectively on the exposed n-type GaN surface 120 and on the exposed p-type GaN layer 160 surface. As described above, the first electrode 170 comprises a metallic material. The metallic material achieving preferable ohmic characteristics contains two metals of titanium forming direct contact with the n-type GaN layer 120, and a layer of aluminum formed on the titanium layer. In order to obtain a perfect ohmic contact, annealing the metallic material layer is required. The annealing treatment is preferably conducted at a temperature of 400 degree. C. or more.

According to the perfect ohmic characteristics of the contacting metallic material on the p-type GaN layer 160 and annealing the metallic material, the present invention provides a second electrode 180 that includes a plurality of opaque contact dots within the metallic material and a transparent conducting layer (or a light reflective conducting layer) forming on the p-type GaN layer 160. First, a plurality of contact dots, which are of a particularly preferable metallic material containing gold, nickel, platina, palladium, tungsten, tungsten silicide, chromium, tantalum, ZnAu alloy, or BeAu alloy are preferably formed on the p-type GaN layer 160. After that, the annealing treatment is preferably conducted at a temperature of 400 degree. C. or more. In this way, the ohmic contact dots 182 converted from the contact dots are in perfect ohmic contact with the p-type GaN layer 160.

In order to obtain a transparent electrode, the present invention then provides a transparent conductive layer 184 deposited on the p-type GaN layer 160 and covering the ohmic contact dots 182. According to the embodiment of the present invention, the transparent conductive layer 184 is an indium tin oxidation (ITO) layer, a cadmium tin oxidation (CTO) layer, an indium zinc oxidation (IZO) layer, a nickel oxidation (NiO) layer or a zinc oxidation (ZnO) layer, so that the light emitting from the light emitting device can entirely transmit through the second electrode 180. Finally, the bonding pad 190 is directly formed on the second electrode 180, and electrically connects to the second electrode 180.

Figure 6:
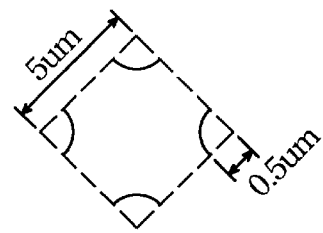
FIG. 6 is an amplified view showing the area in the dash square in FIG. 4.

Because the ohmic contact dots 182 are opaque, the ohmic contact dots, which are formed on the p-type GaN layer 160 surface, can be computed to obtain the maximum light transparent efficiency and uniform current distribution. For instance, an amplified view of the area in the dash-square in FIG. 4 is shown in FIG. 6. As shown in FIG. 6, one circle of 1 um diameter is in the 5 um square area, so that the transparent efficiency approximates to 0.97. Because of the uniform distribution of the ohmic contact dots 182 on the p-type GaN 160, the current is uniformly spread to the p-type GaN 160 and the light intensity is hence enhanced. Also, the reliability of the light emitting device is improved.

In order to obtain a light emitting from the surface of the sapphire 110, the present invention then provides a light reflective conductive layer, which replaces the transparent conductive layer 184 in FIG. 5, deposited on the p-type GaN layer 160 and covering the ohmic contact dots 182. According to the embodiment of the present invention, the light reflective conductive layer is argentum, chromium, aluminum, gold or copper. Consequently, the light-emitting from the light emitting device can be entirely reflected from the high reflectivity conductive layer and emits from the surface of the sapphire 110.

The processes of the present invention are simpler than the conventional processes, because the conventional processes include an etching step to complete the second electrode, which is skipped in this invention. The bonding pad of the present invention is directly formed on the second electrode 180, and the processes are simplified.

Figure 7:
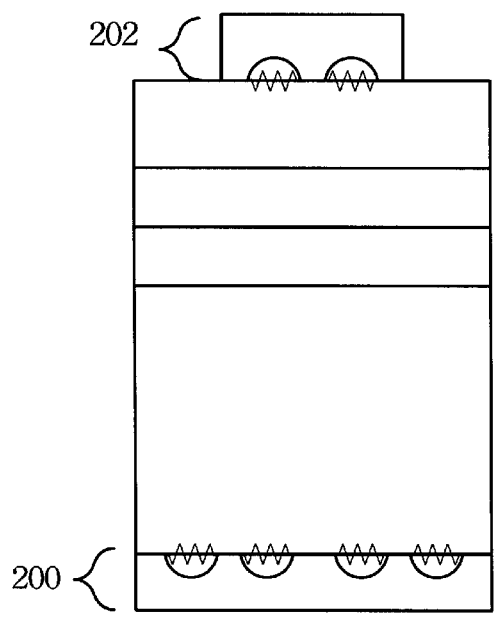
FIG. 7 shows the n-electrode of the present invention formed on the GaAs-based, InP-based, GaP-based, SiC-based or ZnSe-based semiconductor light emitting device.

Referring to FIG. 7, a schematic diagram shows the n-electrode of the present invention formed on the GaAs-based, InP-based, GaP-based, SiC-based or ZnSe-based semiconductor light emitting device. Utilizing the method described above to form the n-electrode 200 and the p-electrode 202 having the transparent electrode or the reflective electrode, the light emitting device will have higher output efficiency or higher reflective rate. Therefore, if the material of the electrode is selected, the light emitting device can emit light from either top and bottom surfaces or both of them. Because of the flexibility design, the light generated from the active layer can also be reflected from either top or bottom surfaces and then emits from another. So that, depending on the different purpose of the electrodes, which are transparent or reflective layer, formed on the substrate, they will highly improved the output efficiency of the device.

It is therefore an advantage of this invention to provide a method and structure for forming an electrode to fabricate light emitting devices. The present invention provides a transparent electrode or a reflective electrode formed on a p-type gallium nitride-based compound semiconductor. The electrode comprises a plurality of opaque ohmic contact dots formed on the p-type gallium nitride-based compound semiconductor and a transparent conductive layer (or a light reflective conductive layer) covering the p-type gallium nitride-based compound semiconductor.

It has another advantage of this invention to provide a method and structure to form high transparent, good ohmic contact and reliable electrode to fabricate light emitting devices. Comparing with the conventional electrode formed on p-type GaN-based III-V compound semiconductor, the present invention has advantages of higher light extractive efficiency and ease to process. Moreover, utilizing the present invention, the electrode is suitable for any light emitting devices. The efficiency of the light emitting devices is higher than that of the conventional ones. Furthermore, this process of forming the electrode is easier than that of the conventional process.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A structure for forming an electrode on a light emitting device, comprising:
   a semiconductor layer of said light emitting light device having a first surface and a second surface;
   a plurality of annealed ohmic contact dots located on said first surface; and
   a conductive layer covering said annealed ohmic contact dots and said first surface.

2. The structure according to claim 1, wherein said semiconductor is a gallium nitride-based III-V compound semiconductor.

3. The structure according to claim 2, wherein said semiconductor layer is a p-type gallium nitride-based III-V compound semiconductor.

4. The structure according to claim 3, wherein said annealed ohmic contact dots are formed of a metallic material comprising a layer of nickel provided in direct contact with said first surface, and a layer of gold provided on said nickel layer.

5. The structure according to claim 3, wherein said annealed ohmic contact dots are selected from a gold, a nickel, a platina, a palladium, a tungsten, a tungsten silicide, a chromium, a tantalum, a ZnAu alloy, and a BeAu alloy.

6. The structure according to claim 1, wherein said conductive layer is a transparent conductive layer.

7. The structure according to claim 6, wherein said transparent conductive layer is selected from an indium tin oxidation (ITO) layer, a cadmium tin oxidation (CTO) layer, an indium zinc oxidation (IZO) layer, a nickel oxidation (NiO) layer and a zinc oxidation (ZnO) layer.

8. The structure according to claim 1, wherein said conductive layer is a light reflective conductive layer.

9. The structure according to claim 8, wherein said light reflective conductive layer is selected from an argentum, a chromium, an aluminum, a gold, and a copper.

10. The structure according to claim 1, wherein said semiconductor is a GaAs-based compound semiconductor.

11. The structure according to claim 1, wherein said semiconductor is an InP-based compound semiconductor.

12. The structure according to claim 1, wherein said semiconductor is a GaP-based compound semiconductor.

13. The structure according to claim 1, wherein said semiconductor is a SiC-based compound semiconductor.

14. The structure according to claim 1, wherein said semiconductor is a ZnSe-based compound semiconductor.

15. A method for forming an electrode on a light emitting device, comprising:
   forming a plurality of contact dots on a surface of a semiconductor layer of said light emitting light device;
   processing a annealing treatment; and
   forming a conductive layer covering said contact dots and said surface.

16. The method according to claim 15, wherein said semiconductor is a gallium nitride-based III-V compound semiconductor.

17. The method according to claim 16, wherein said semiconductor layer is a p-type gallium nitride-based III-V compound semiconductor.

18. The method according to claim 15, wherein said contact dots are formed of a metallic material comprising a layer of nickel provided in direct contact with said first surface, and a layer of gold provided on said nickel layer.

19. The method according to claim 15, wherein said ohmic contact dots are selected from a gold, a nickel, a platina, a palladium, a tungsten, a tungsten silicide, a chromium, a tantalum, a ZnAu alloy, and a BeAu alloy.

20. The method according to claim 15, wherein said contact dots have been subjected to an annealing treatment at a temperature of 400 degree. C. or more.

21. The method according to claim 15, wherein said conductive layer is a transparent conductive layer.

22. The method according to claim 21, wherein said transparent conductive layer is selected from an indium tin oxidation (ITO) layer, a cadmium tin oxidation (CTO) layer, an indium zinc oxidation (IZO) layer, a nickel oxidation (NiO) layer and a zinc oxidation (ZnO) layer.

23. The method according to claim 15, wherein said conductive layer is a light reflective conductive layer.

24. The method according to claim 23, wherein said light reflective conductive layer is selected from an argentum, a chromium, an aluminum, a gold, and a copper.

25. The method according to claim 15, wherein said semiconductor is a GaAs-based compound semiconductor.

26. The method according to claim 15, wherein said semiconductor is an InP-based compound semiconductor.

27. The method according to claim 15, wherein said semiconductor is a GaP-based compound semiconductor.

28. The method according to claim 15, wherein said semiconductor is a SiC-based compound semiconductor.

29. The method according to claim 15, wherein said semiconductor is a ZnSe-based compound semiconductor.

30. A structure for forming an electrode on a light emitting device, comprising:
   a semiconductor layer of said light emitting light device having a first surface and a second surface;

a plurality of annealed ohmic contact dots located on said first surface; and a conductive layer covering said annealed ohmic contact dots and said first surface, wherein said semiconductor layer is a p-type gallium nitride-based III-V compound semiconductor, and said annealed ohmic contact dots have been subjected to an annealing treatment at a temperature of 400 degree. C. or more.

31. The structure according to claim 30, wherein said annealed ohmic contact dots are formed of a metallic material comprising a layer of nickel provided in direct contact with said first surface, and a layer of gold provided on said nickel layer.

32. The structure according to claim 30, wherein said annealed ohmic contact dots are selected from a gold, a nickel, a platina, a palladium, a tungsten, a tungsten silicide, a chromium, a tantalum, a ZnAu alloy, and a BeAu alloy.

33. The structure according to claim 30, wherein said conductive layer is a transparent conductive layer.

34. The structure according to claim 33, wherein said transparent conductive layer is selected from an indium tin oxidation (ITO) layer, a cadmium tin oxidation (CTO) layer, an indium zinc oxidation (IZO) layer, a nickel oxidation (NiO) layer and a zinc oxidation (ZnO) layer.

35. The structure according to claim 30, wherein said conductive layer is a light reflective conductive layer.

36. The structure according to claim 35, wherein said light reflective conductive layer is selected from an argentum, a chromium, an aluminum, a gold, and a copper.

37. The structure according to claim 30, wherein said semiconductor layer is a GaAs-based compound semiconductor.

38. The structure according to claim 30, wherein said semiconductor layer is an InP-based compound semiconductor.

39. The structure according to claim 30, wherein said semiconductor layer is a GaP-based compound semiconductor.

40. The structure according to claim 30, wherein said semiconductor layer is a SiC-based compound semiconductor.

41. The structure according to claim 30, wherein said semiconductor layer is a ZnSe-based compound semiconductor.

* * * * *